(12) United States Patent
Wolf

(10) Patent No.: US 11,561,265 B2
(45) Date of Patent: Jan. 24, 2023

(54) CUTOUT LIFE INDICATOR GAUGE

(71) Applicant: Hubbell Incorporated, Shelton, CT (US)

(72) Inventor: Robert Wolf, Birmingham, AL (US)

(73) Assignee: HUBBELL INCORPORATED, Shelton, CT (US)

(*) Notice: Subject to any disclaimer, the term of this patent is extended or adjusted under 35 U.S.C. 154(b) by 959 days.

(21) Appl. No.: 16/379,880

(22) Filed: Apr. 10, 2019

(65) Prior Publication Data

US 2019/0317142 A1 Oct. 17, 2019

Related U.S. Application Data

(60) Provisional application No. 62/760,559, filed on Nov. 13, 2018, provisional application No. 62/657,122, filed on Apr. 13, 2018.

(51) Int. Cl.
| | |
|---|---|
| *G01R 31/74* | (2020.01) |
| *H01H 85/42* | (2006.01) |
| *H01H 85/18* | (2006.01) |
| *G01D 7/00* | (2006.01) |

(52) U.S. Cl.
CPC .............. *G01R 31/74* (2020.01); *H01H 85/18* (2013.01); *H01H 85/42* (2013.01); *G01D 7/007* (2013.01)

(58) Field of Classification Search
CPC ........... H01H 85/42; H01H 2085/0216; H01H 85/20; H01H 85/38; H01H 31/127; G01R 31/74
See application file for complete search history.

(56) References Cited

U.S. PATENT DOCUMENTS

| | | | |
|---|---|---|---|
| 4,313,100 A | 1/1982 | Schmunk | |
| 4,317,099 A | 2/1982 | Sabis | |
| 6,922,132 B2 | 7/2005 | Montante | |
| 9,704,674 B2 | 7/2017 | Kester et al. | |
| 2005/0104709 A1* | 5/2005 | Montante | H01H 31/127 337/171 |
| 2013/0162136 A1* | 6/2013 | Baldwin | H01J 1/30 313/311 |
| 2013/0285787 A1* | 10/2013 | Salazar | H01H 85/22 337/168 |
| 2016/0013002 A1* | 1/2016 | Kester | H01H 85/20 337/246 |

* cited by examiner

*Primary Examiner* — Mirza F Alam
(74) *Attorney, Agent, or Firm* — Dilworth IP, LLC

(57) ABSTRACT

A gauge for determining the operational viability of a device that requires that a consumable or otherwise erodible material for safe and/or efficient operation reside along or near an inside wall of a cavity, for example, a fuse tube containing an ablative arc-extinguishing material as found in a fused cutout, is provided, which gauge measures whether a sufficient quantity of the material to be consumed remains.

16 Claims, 8 Drawing Sheets

CUTOUT LIFE INDICATOR GAUGE

The present invention provides a gauge for determining the operational viability of a device, which device requires the presence of at least a minimum quantity of a consumable or otherwise erodible material for safe and/or efficient operation, said material typically residing along or near an inside wall of a cavity, for example, a fuse tube containing an ablative arc-extinguishing material as found in a fuse cutout, which gauge measures whether a sufficient quantity of the material to be consumed remains.

BACKGROUND OF THE INVENTION

The safe and/or efficient operation of certain devices relies on the presence of materials within the device that are consumed or otherwise lost during use. Generally, the present discussion relates to devices where the consumable materials not fuels, rather they are generally materials that perform functions other than powering the device. Fuse cutouts, such as associated with power lines, are well known examples of such devices. In a fuse cutout, a high voltage arc forms during the process of a circuit disruption, which arc is extinguished by the presence of a consumable, typically ablative, arc-extinguishing material.

In electrical distribution systems, for example, a fuse cutout comprises a combination of a fuse deployed in a fuse holder and a switch, and is typically found in overhead feeder lines to protect distribution systems and transformers from current surges and overloads. If equipped with appropriate mechanisms, cutouts can act as sectionalizers used on each distribution line downstream from autoreclosing circuit breakers. Autoreclosers sense and briefly interrupt fault currents, and then automatically reclose to restore service. Meanwhile, downstream sectionalizers automatically count current interruptions by the recloser. When a sectionalizer detects a preset number of interruptions of fault current (typically 3 or 4) the sectionalizer opens (while unenergized) and remains open, and the recloser restores supply to the other non-fault sections.

A fuse cutout has three major components. The first component is the cutout insulator body, a generally open "C"-shaped frame that supports a fuse holder and a ribbed porcelain or polymer insulator that electrically isolates the conductive portions of the assembly from the support to which the insulator is fastened. The second component is the fuse element, or "fuse link", which is the replaceable portion of the cutout assembly that operates when the electrical current is great enough. The third component is the fuse holder, also called the "fuse tube", which is an insulating tube which contains the replaceable fuse element and ablative arc extinguishing material.

Fuse links and fuse tubes of various configurations and comprising ablative arc-extinguishing materials are known, e.g., U.S. Pat. Nos. 4,313,100; 4,317,099; 6,922,132; 9,704,674, etc.

U.S. Pat. No. 9,704,674 discloses a fuse holder for a fuse cutout comprising a short fuse tube section, which fuse holder has an arc-quenching liner, which may comprise bone fiber as commonly deployed in the art, a synthetic liner comprising a cross-linked fiberglass shell overmolded with plastic weathershed, or filament wind/grind/epoxy paint coating, or a filament wind/over mold where the overmolded material is thermal set BMC or thermal plastic having weathering resistive compositional additives. In one embodiment, the liner utilizes epoxy resin for the matrix, with polyester fiber and e-glass fiber as the composite reinforcement materials. In a preferred embodiment, ATH is added to the resin as the main constituent to generate arc quenching gasses. The polyester fiber ablates to expose more ATH through successive operations.

When the fuse element operates ("blows"), the fuse holder breaks the circuit, then drops out of an upper contact and hangs from a hinge on its lower end. The hanging fuse holder provides a visible indication that the fuse has operated and assurance that the circuit is open. An overcurrent caused by a fault in the transformer or customer circuit will cause the fuse to melt, disconnecting the transformer or faulted circuit from the line.

To facilitate disconnection, cutouts are typically mounted about 20 degrees off vertical so that the center of gravity of the fuse holder is displaced and the fuse holder will rotate and fall open under its own weight when the fuse blows. Mechanical tension on the fuse link normally holds an ejector spring in a biased position. When the fuse blows, the released spring pulls the stub of the fuse link out of the fuse holder tube during the fault clearing process. The electric arc is quenched within the fuse holder, limiting duration of the fault event. The cutout can also be opened manually by utility linemen standing on the ground and using a long insulating stick called a "hot stick".

In operation, after the fuse link has blown and the fuse holder drops, a lineman replaces the fuse link and re-deploys the fuse tube in its operating condition. The fuse holder is also equipped with a pull ring that can be engaged by a hook at the end of a fiberglass hot stick operated by a lineworker standing on the ground or from a bucket truck, to manually open the switch.

However, safe reuse of the fuse tube requires the presence of a sufficient amount of arc-extinguishing material. Currently, there is no way to be sure that enough ablative arc-extinguishing material remains. Fault currents vary between faults as does the wear on the tube, and the amount of arc-extinguishing material lost during each interruption is not constant. Thus, simply tracking the number of faults is not a reliable means for determining the lifecycle of the fuse tube.

The ablative arc extinguishing material of a fuse tube resides along the inside wall of the tube in a manner that leaves a channel or bore, bordered by the ablative material, that runs lengthwise through the center of the tube. One end of the channel or bore is tapered or stepped to form a wider, exhaust opening of the tube, which aids in the exhaust of the gasses generated during arc formation and extinction, by preventing gas stagnation in the bore. The ablative material consumed during arc extinction is lost most readily from the wider exhaust end. After repeated circuit interruptions, what remains of the ablative arc-extinguishing material is more likely to be found deeper in in the tube, away from the exhaust end.

Currently there is no way of knowing whether a fuse tube is viable for use in the field after undergoing a number of interruptions. There is a clear need for a simple, reliable means for quickly determining whether a sufficient amount of arc-extinguishing material remains in a fuse tube for safe and effective operation after one or more circuit interruptions.

SUMMARY OF THE INVENTION

One embodiment of the present invention provides a gauge capable of providing quick and reliable information regarding whether a fuse tube contains enough ablative arc-extinguishing material along or near a particular section of interest of the fuse tube for safe and effective use. That is, in a first embodiment, a gauge is provided that gives simple yes or no answer about whether a fuse tube, particularly one that has suffered a blowout, has retained sufficient ablative material to still safely and adequately function. In other embodiments, a gauge provides more specific information about the amount of ablative material that has been retained after an incident, e.g., a blowout, which can also serve as a guide as to how much longer the future usable lifetime of the fuse tube might be. In one embodiment, a gauge is configured to provide both the yes/no answer and information on how much arc-extinguishing ablative material is retained. The gauge of the present invention can also be used to provide similar information for other devices that require that a consumable material, or other erodible material, resides along or near an interior wall of a cavity or passageway. It can be readily seen that the cavity must be accessible to the user of the device, and not be in an unreachable position.

Generally, a fuse tube has an outer shell defining an internal cavity. The cavity is lined with an arc-extinguishing ablative material in a manner that leaves a central bore through the ablative material, the bore traversing the length of the tube, bounded by the ablative material. In a fuse tube, the bore traversing the tube and bounded by ablative material is the passageway that comprises the area of interest for the gauge of the invention. The bore at one end of the tube will have a wider inner diameter the majority of the bore to aid in the exhaust of gasses during operation.

The gauge of the invention comprises a grip portion from which extends a gauge body having a shape and size allowing it to be inserted into a cavity or passageway of a device. The gauge body has a distal end away from the grip portion and visible markings on the surface, or etchings into the surface of the body at designated distances from the distal end. The distal end of the body has a shape congruent with the shape of the cavity or passageway in the region of interest, that is, the select region of the cavity or passageway of a device where consumable or otherwise erodible material needs to be located. The size or cross section of the distal end, and often the body of the gauge, is similar to and typically smaller than the perimeter of the cavity or passageway that is traversed in order to reach the select region interest, so as to be slidably disposable therein. When the distal end reaches a point where the opening is smaller than the distal end, due to the presence of ablative material, progress of the gauge will be stopped.

For example, in a gauge for use with a fuse tube having a cylindrical bore bordered by ablative material, the distal end may be circular with a circumference smaller than the circumference of the cavity that would be defined by the outer tube alone in the absence of ablative material to allow entry to the tube, but greater than the circumference of the inner bore that would exist in the presence of an amount of arc-extinguishing material sufficient to block progress. The remaining portion of the gauge body generally has the same size and shape as the distal end, but it need not be, provided that the gauge body it will fit within the cavity being examined. Of course, very little, if any, of the cavity defined by the outer shell of a fuse tube would likely be completely free of ablative material as described above. In actual use, the gauge body is designed to have a small enough cross section to progress through the cavity, passageway, bore etc., but large enough so that progress is stopped when presence of a sufficient amount of material renders the existing cavity or bore too small to allow further passage.

In use, the body of the gauge is inserted into the cavity, passageway, etc., being tested for the presence of the consumable material. Provided there is no other damage to the device, e.g., collapsed walls or broken components blocking progress of the gauge body, the distal end of the body will progress through the cavity until enough material resides along or near the sides of the cavity to constrict the opening enough to block further progress. Typically, the gauge body comprises etchings or markings calibrated to the distance that the gauge body would travel into the cavity if less than the necessary amount of ablative material is present. If the gauge progresses far enough so that the relevant pass/fail marking enters the cavity and can not be seen, then not material remains for continued safe and effective use. If the mark is still visible outside the cavity when progress of the gauge is stopped, then there is sufficient ablative material.

The length, width and/or load level of ablative arc-extinguishing material will vary between different fuse tubes, e.g., between fuse tubes designed for different kV ratings, and the gauge can be adjusted to reflect such changes. For example, the outer shell of one fuse tube rated for 15 kV is about 9.5 inches long and has an inner cavity that when hollow has a diameter of 1 inch. The inner walls of the tube are lined with ablative arc-extinguishing material, for example, bone fiber, a synthetic ablative plastic comprising an arc extinguishing agent such as ATH, etc. The ablative material defines a cylindrical cavity, i.e., inner bore, with a wider, tapered or stepped, conical end section, which conical end section comprises an exhaust opening with a diameter of 0.59 inches, which is the widest opening in the bore. The conical end section extends inward from the exhaust opening for 2.7 inches where it meets a regularly shaped cylindrical passageway with an opening of 0.5 inches leading through the rest of the tube.

While other tubes, such as those with different kV ratings may have a wider shell and inner cavity, it is not necessary. For example, another tube, with a 27 kV rating, has a shell with the same 1 inch inner cavity as above but which is 13 inches long. It is lined with the same ablative material, however the tapered or stepped conical exhaust end extends inward from a 0.65 inch diameter exhaust opening for 4.5 inches where it meets a regularly shaped cylindrical passageway with an opening of 0.5 inches leading through the rest of the tube.

It is possible to use a single gauge for each tube, but the distance the gauge body must pass through the tube will vary. Such a gauge will be long enough to reach the critical distance determining the pass/fail point for the 27 kV tube but will bear pass/fail markings for both the shorter pass/fail distance for 15 kV tube and the longer distance for the 27 kV tube.

In another embodiment of the invention, the gauge body has a series of hatch marks, i.e., a plurality of markings on the surface, or etchings into the surface, of the gauge body, which hatch marks measure the depth to which the distal end has proceeded through the cavity. As opposed to the above pass/fail markings, which are positioned simply to mark the depth associated with an unsafe loss of ablative material, the hatch marks actually measure the depth, typically in absolute linear units such as inches, centimeters, etc., to which the distal end has travelled in the cavity, regardless of the pass/fail distance. In some embodiments the hatch marks and the pass/fail markings will be present on the same gauge body.

Recent work has shown that the distance the gauge body progresses into the cavity of a fuse tube, can be correlated with amounts of material that has been ablated. Further, the amount of ablative material lost during a fuse blowout has been shown to be proportional to the energy to which the fuse tube is subjected during the fuse blow out. Thus, in addition to obtaining a quick, yes or no answer regarding whether enough ablative arc-extinguishing material remains in a fuse tube for safe operation after a fuse blows, one can also determine the amount of ablative material that remains and estimate how many more blowouts the fuse tube can endure before it is removed from service or refurbished.

The drawings herein are for illustration purposes only and are not drawn to scale unless otherwise indicated. The drawings are not intended to limit the scope of the invention.

DISCUSSION OF THE INVENTION

The invention is hereby illustrated using embodiments wherein the gauge is designed with a cylindrical, rod-like gauge body, suited for determining whether sufficient arc-extinguishing material remains in a fuse tube having a largely cylindrical bore. One skilled in the art can readily apply the following discussion to gauges of the invention having different shaped gauge bodies and those useful for other devices.

Figure 1:
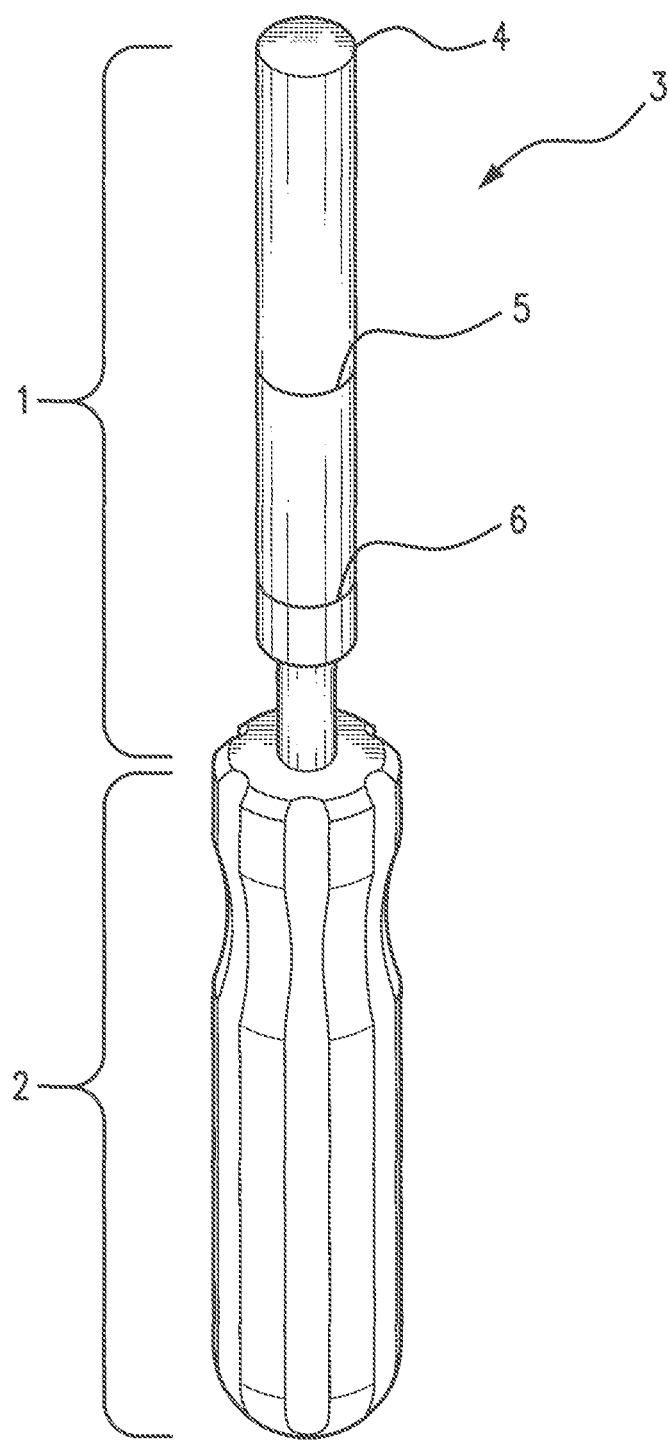
FIG. 1 shows a gauge of the invention with a cylindrical gauge body comprising pass/fail markings, suitable for use with a fuse tube.

FIG. 1 shows a gauge of the invention comprising a gauge portion (1) comprising a gauge body (3) and any intervening elements that may exist between the gauge body (3) itself and a grip portion (2). The gauge body (3) has a distal end (4) and, in this case, two pass/fail markings or etchings (5) and (6) at selected distances from the distal end (4). Obviously, other embodiments may comprise a single marking or etching or more than two markings or etchings. The drawing illustrates the main elements of the gauge, but one skilled in the art will readily recognize that the proportions will vary based on the size and depth of the internal cavities.

For example, considering the 15 kV tube and 27 kV tube discussed above, which have the same 0.5 inch diameter for the regularly cylindrical bore through the ablative material, a single cylindrical gauge can be used on both, provided it was calibrated to the failure point of each tube. If the gauge has a diameter of just over 0.5 inches, its progress would be blocked at the point where the conical section of the tube passageway met the narrow cylindrical section of the bore, i.e., 2.7 inches in an unused 15 kV tube and 4.5 inches in an unused 27 kV tube. Such a gauge body could bear identifying markings at 2.7 and 4.5 inches from the distal end of the gauge body. A slightly wider gauge body would be blocked by the ablative material at a shorter insertion distance in the conical section, and the markings would be adjusted accordingly. Of course, the gauge body lengths recited are based on the distance from the opening of the tube to the internal bore in an unused tube. In the field, one will reuse a fuse tube that no longer has the full compliment of ablative material after a blow out, and the distance between the distal end and the pass/fail markings will be set to align with the measurable point at which the ablative material becomes insufficient for use.

For example, one embodiment provides a gauge according to FIG. 1, useful for determining whether a sufficient quantity of arc extinguishing material remains in a fuse tube, having a cylindrical gauge body with a diameter of 0.51 to 0.59 inches, e.g., 0.51 to 0.57 or 0.51 to 0.54 inches and a length greater than 4.75 inches, e.g., greater than 5.0, 6 or 7 inches, wherein the gauge body bears a marking or etching at a distance 2 to 3.3 inches from the distal end, e.g., 2.5 to 3.0 inches from the distal end and another marking or etching at a distance 3.7 to 4.7 inches from the distal end, e.g., 4.2 to 4.6 inches from the distal end. Obviously, if the fuse tubes under consideration can be considered safely operational with less ablative material, the gauge body will have to progress deeper into the fuse tube before being blocked at the region of interest, and thus the distance from the distal end to the pass/fail markings are longer, or the diameter of the gauge body, especially at the distal end, will be larger.

The pass/fail markings discussed above quickly answer the question of whether the fuse tube has retained enough ablative arc extinguishing material for future use after a fuse blow out. Other information about the amount of arc quenching material in a fuse tube can be provided by other aspects of the inventive gauge.

Figure 2:
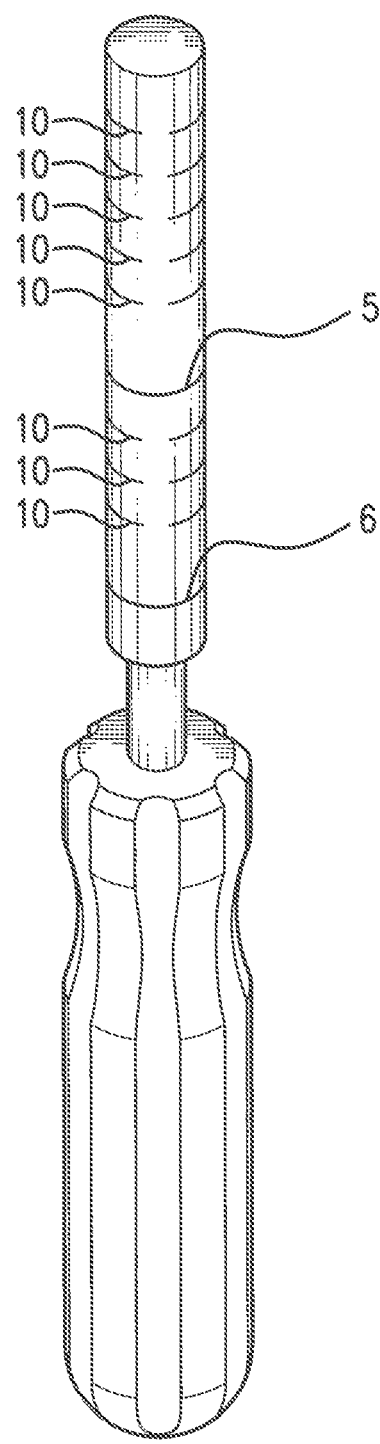
FIG. 2 shows a gauge of the invention with a cylindrical gauge body comprising pass/fail markings and hatch marks, suitable for use with a fuse tube.

FIG. 2 illustrates an embodiment wherein the gauge body comprises a series of hatch marks (10), shown here as broken lines, located along length of the gauge body to measure the actual depth the distal end of the gauge body has proceeded into the cavity. The hatch marks are a plurality of markings on, or etchings into, the gauge body, generally at regular intervals, i.e., wherein the spacing between and two adjacent hatch marks is the same, such as found on a ruler. The hatch marks need not be at regular intervals, e.g., they may be closer together at places where a more accurate measure is needed, etc. The number of hatch marks, the spacing between them, and whether they are regularly spaced can vary. While one may use two hatch marks on the device, much more accurate information can be obtained by using more hatch marks. Typically, 3 to 25, 3 to 20, 3 to 15, or 3 to 10 hatch marks are present. When the gauge body is inserted into the cavity, the hatch marks that remain visible to the user convey the length of the gauge that has entered the cavity.

Figure 7:
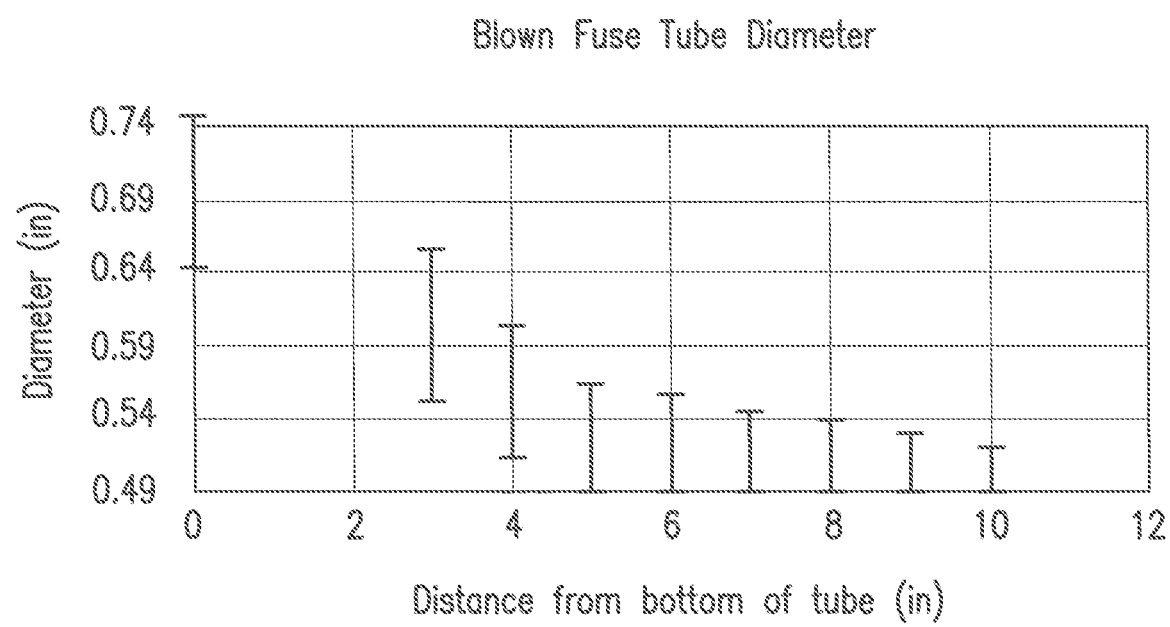
FIG. 7 shows a graph depicting the diameter of the tube opening at various distances from the exhaust end after an ablation event.

It recently has been determined that the bore or pathway through the center of the ablative arc-quenching material retains the same overall shape during and after a blow out that it had before the blow out. That is, while some ablative material lost, and the overall cavity defined by the tube plus ablative material is larger, the cavity maintains its tapered shape, having an opening with a large diameter at the exhaust end, a narrow opening at the opposite end and a narrow inner bore between the two. FIG. 7 shows the size of the opening after ablation at various distances along the fuse tube, the I-bar brackets show the range of opening sizes for several test series. While there is some scatter in the sizes, the diameter of the cavity decreases as one progresses from the exhaust end up through the cavity.

The amount of ablation at various stages of loss can be correlated with the diameter of the cavity at different depths. When the gauge of the invention bearing hatch marks is blocked at a depth that is less than the pass/fail point, the distance to the blocking point can be read from the hatch marks. The distance data can be used to determine how much ablative material remains, and how many more blow-outs the fuse tube likely can endure before it will need to be replaced or refurbished. The number of future blow outs is an estimate because blow outs, and the energy generated and released during them, can vary and cause different amounts of ablation.

Figure 8:
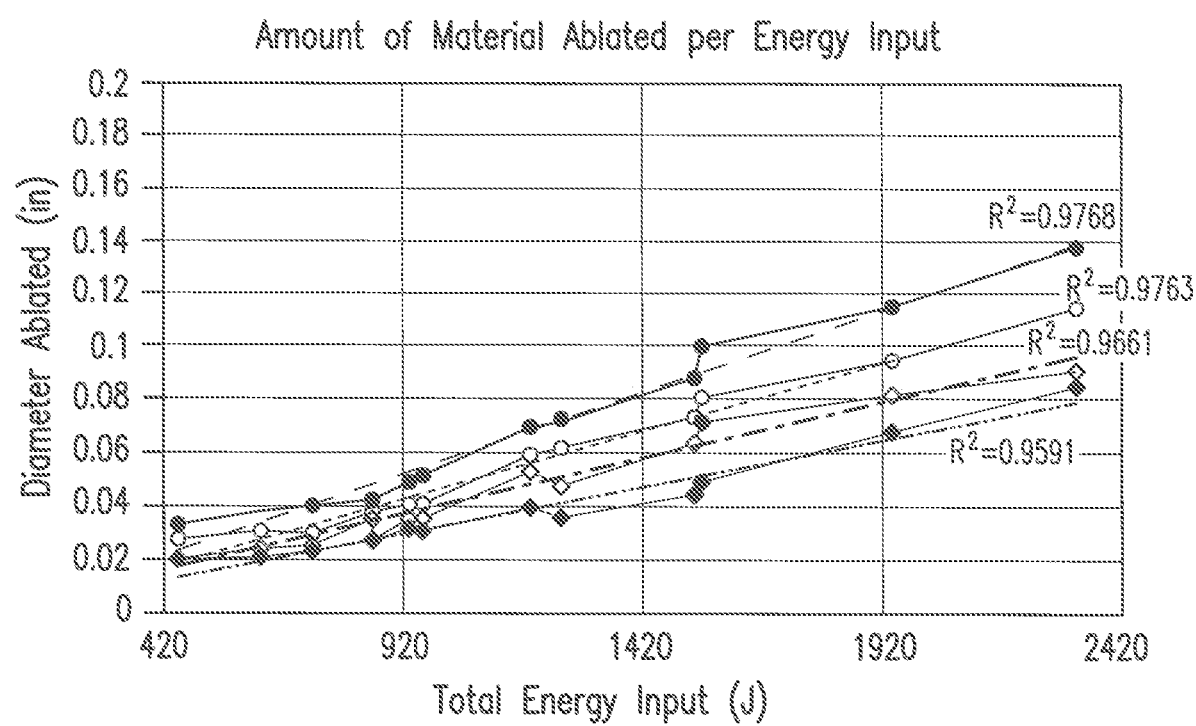
FIG. 8 shows a graph plotting the diameter of the tube opening after ablation at various energy levels.

It has also been shown that the amount of material lost during an ablative event can be correlated with the energy to which the fuse tube was subjected. FIG. 8 shows that the loss in inches of ablative material from each of four different tubes is proportional to the energy input, $R^2$ values for each line are provided. One is thus capable of estimating how much ablative material has been lost by knowing how far the gauge body penetrated the fuse tube cavity before being blocked, which can be used to determine the amount of energy to which the fuse tube was exposed.

Figure 3:
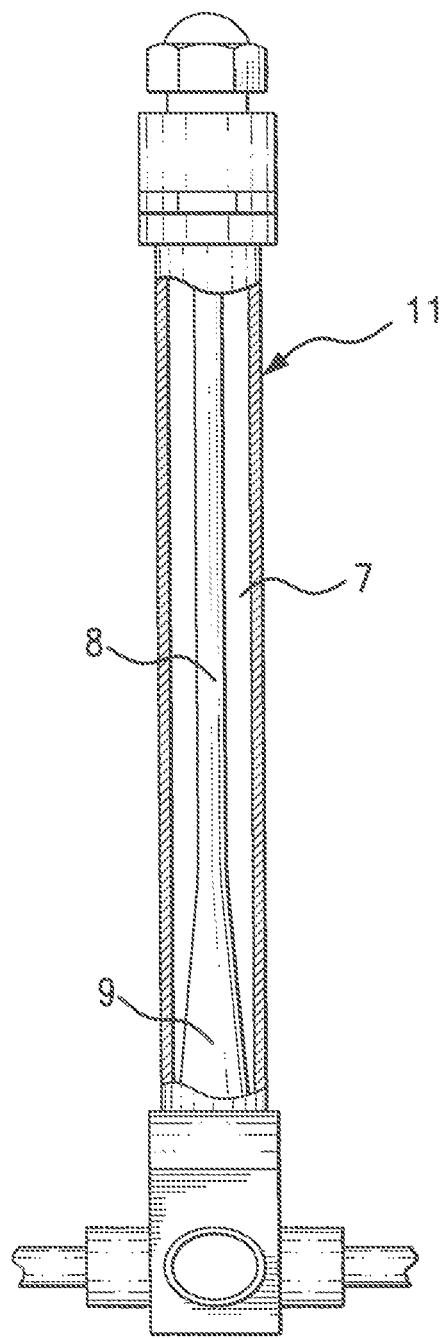
FIG. 3 shows part of a fuse tube cut open along its length to show a bore with a tapered, wide exhaust end, and a deeper, more narrow region.

In many embodiments, as in FIG. 2, the pass/fail markings are present on the gauge body along with the hatch marks, but this is not always required. When the pass/fail marks and the hatch marks are both present, it is often necessary to take steps to differential the hatch marks from the pass/fail marks. In FIG. 3 the hatch marks are presented as broken lines as opposed to the continuous lines of the pass/fail marks. Other methods for differentiation include different widths, darkness or color, other shapes etc. Labeling the different sets of markings differently, e.g., placing an index along the hatch marks as found on a ruler, e.g., 0.1", 0.2" . . . and/or placing identifying labelling on the pass/fail markings would also serve the purpose. As seen in FIG. 2, the hatch marks may coincide with a pass fail/mark, but dealing with this situation will be obvious to one skilled in the art.

While there is no limitation on the materials used in preparing the gauge of the invention, it is highly desirable that the body of the gauge, especially at the distal end, not become deformed. Thus, the body of the gauge, particularly at the distal end, is typically made of material that is highly resistant to deformation, such as hardened metals and alloys, e.g., high hardness aluminum. In general, the entire body is made from the same highly deformation resistant material, but parts of the body away from the distal end can be made of a different material.

In many embodiments, e.g., when using a metal or metal alloy for the gauge body (3), the markings or etchings (5), (6) etc., are etchings. In the embodiment shown in FIG. 1, the gauge has two etchings, each associated with the amount of arc-extinguishing material needed for a specific kV level, along the face of the gauge body (3) indicating the depth the gauge shall not go past, when inserted into the fuse tube, if the tube is in working condition for a specific kV level of the tube.

The cross section of the distal end of the gauge body (3) has the same or similar shape as the cross section of the opening defined by the inner walls of the ablative material lined cavity in the region of interest. For example, the round, cylindrical shape of the gauge body (3) shown in FIG. 1, with the circular distal end (4), is ideally suited for use in a device with a cylindrical bore or passageway defining an interior circular cross section.

The size of the distal end (4) cross section, in this case the circumference of the circle at the distal end, is smaller, sometimes slightly smaller, than that of the circumference of the circle defined by the inner wall of the cylindrical opening at the point at which the gauge body is first inserted. Obviously, any portion of the gauge body that will enter device must be smaller than the opening in order for body of the gauge to progress through the bore.

In the 15 and 27 kV tubes above, one could select a gauge diameter of 0.5 to just under 0.59 inches, which provide a gauge suitable for either tube. The diameter would reflect a specific point inside the fuse tube e.g., in the cone or the cylindrical part of the passageway through the ablative material, that the operator selects for measurement. Given the larger exhaust opening of the 27 kV tube, a gauge diameter up to 0.65 inches could be selected, but this would find limited used in the 15 kV tube, having an exhaust opening of 0.60 inches for the 15 kV, unless large loses of ablative material could be tolerated.

While the size of the distal end is smaller than the size of the cavity opening in the absence of sufficient ablative arc-extinguishing material, it is larger than the opening in the area of interest that would exist in the presence of sufficient material. Any size between these two extremes would suffice. In some embodiments, the shape of the distal end need not match the shape of the opening, provided that the gauge body will progress through the cavity when no or small amounts of material are present, but will be blocked when contacting significant amounts of material, e.g., amounts deemed to be sufficient for safe and/or efficient operation.

For example, in some embodiments, the size difference between the circumference of the distal end of the gauge body and an empty cavity of a fuse tube is just enough to allow for progress of the gauge body through the bore. In such a circumstance, it will take a very small amount of additional material residing along the bore wall to block progress of the gauge body. A larger difference between the circumference of the distal end and the tube opening will mean that progress of the gauge body will continue when passing a mere trace of arc quenching material but will still be blocked when encountering an area where the amount of material constructs the opening enough to prevent passage. In some embodiments, a gauge body and distal end are designed to be roughly the same size or slightly larger than the size of the opening that exists in the bore when sheathed with a full complement, i.e., the originally installed amount, of the arc extinguishing material.

In some embodiments, the entire length of the gauge body will have the shape and size of the distal end. In other embodiments, portions of the body will be a different size and/or shape, however, any part of the gauge that might enter the cavity or passageway being subjected to the present measurements must be the same size or smaller than the distal end to avoid impinging the inner walls of the cavity.

The grip portion (2) of the gauge can comprise any suitable material. Many embodiments employ an ergonomically designed handle, prepared, e.g., from molded polymer, e.g., a thermoplastic polymer or a natural or synthetic rubber, to provide a more easily used gauge. In some embodiments, the polymeric handle is molded directly over a part of the gauge portion of the gauge, which is then embedded in the grip. The gauge body can be connected directly to the grip portion, or intermediate elements may connect the gauge body to the grip portion.

FIG. 3 shows the inner cavity of a fuse tube. The cavity is defined by the interior of the outer shell (11), which is lined with an ablative, arc-extinguishing material (7). This provides an inner bore having a regularly shaped cylindrical portion (8) that extends through much of the tube with a wide, tapered exhaust end (9) at one end through which gasses are vented. Ablative, arc-extinguishing material (7) surrounds the inner bore and extends deep into the tube. In use, as the arc-extinguishing material (7) is consumed to a greater extent at or near the exhaust end, extending the taper portion of the working channel deeper into the tube. Typically, a gauge of the invention, designed for use with this fuse tube will be of sufficient length so the gauge body can enter through the opening at the wider, tapered exhaust end (9), and progress to the deeper section (8).

Figure 4:
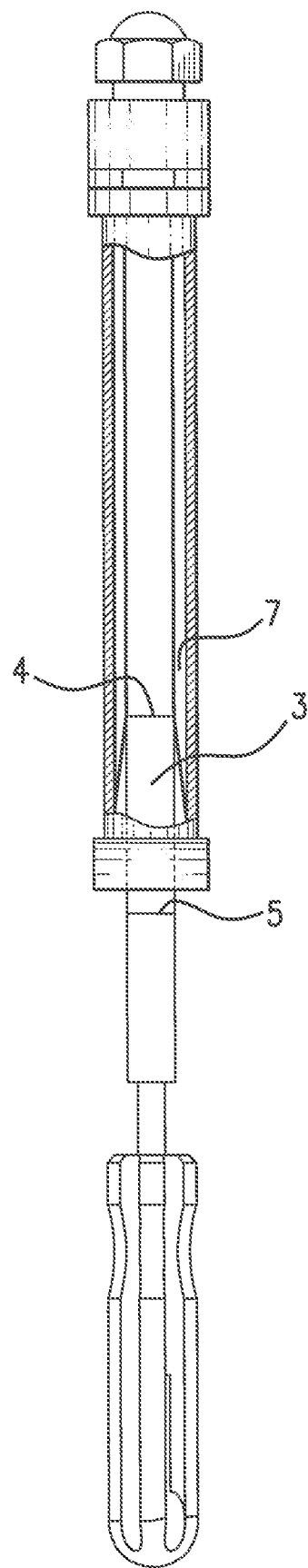
FIG. 4 schematically shows the insertion of a gauge of the invention with a cylindrical gauge body comprising pass/fail markings into a fuse tube after the loss of some ablative arc-extinguishing material due to use, but with enough ablative arc-extinguishing material for further use.

FIG. 4 schematically shows the gauge inserted into a fuse tube similar to that of FIG. 3, cut open along its length to illustrate the penetration of the gauge. For illustrative purposes the fuse tube shown here is isolated from connectors that would hold it in place during use, but, as known in the art, fuse tubes can be serviced without being so completely disconnected. In FIG. 4, the gauge body (3) has been inserted through the opening at exhaust end (9) until the distal end (4) reached a region containing an effective amount of remaining ablative arc-extinguishing material (7). The pass/fail etching (5) remains visible outside the fuse tube, signaling that enough ablative arc-extinguishing material remains within the fuse tube for it to be refurbished and reused.

Figure 5:
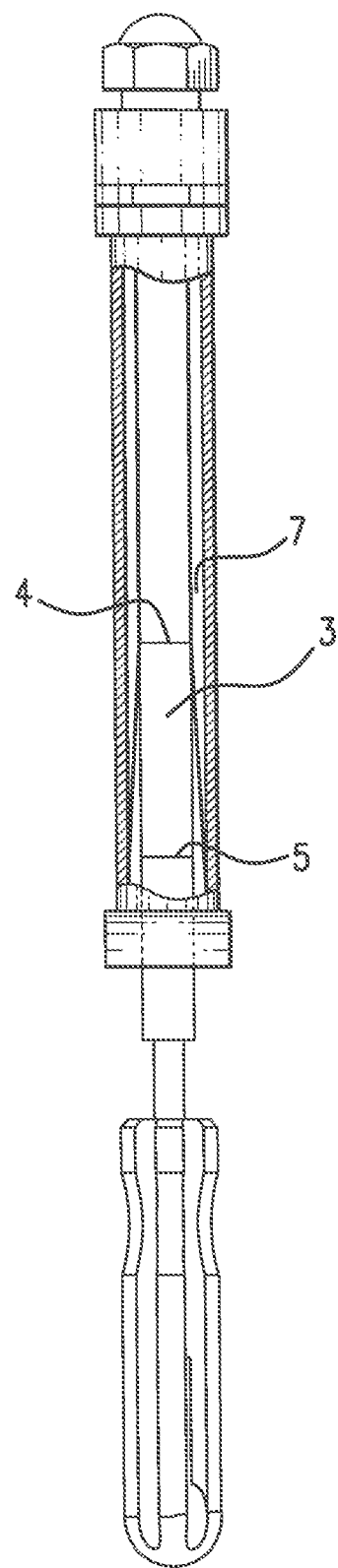
FIG. 5 schematically shows the insertion of a gauge of the invention with a cylindrical gauge body comprising pass/fail markings into a fuse tube after significant loss of ablative arc-extinguishing material due to use, now having with insufficient ablative arc-extinguishing material for further use.

FIG. 5 is similar to FIG. 4 and schematically shows the gauge inserted into a similar fuse tube. However, in FIG. 5, more of the ablative arc-extinguishing material (7) has been consumed and the distal end (4) of the gauge body (3) has progressed through the tube to a much greater extent before encountering a region containing a significant amount of remaining ablative arc-extinguishing material (7). Enough of the gauge body (3) has entered the tube at this point that the pass/fail etching (5) is now inside the tube and is no longer visible to the user. Thus, the fuse tube in FIG. 5 does not have enough arc-extinguishing material to be reused.

Figure 6:
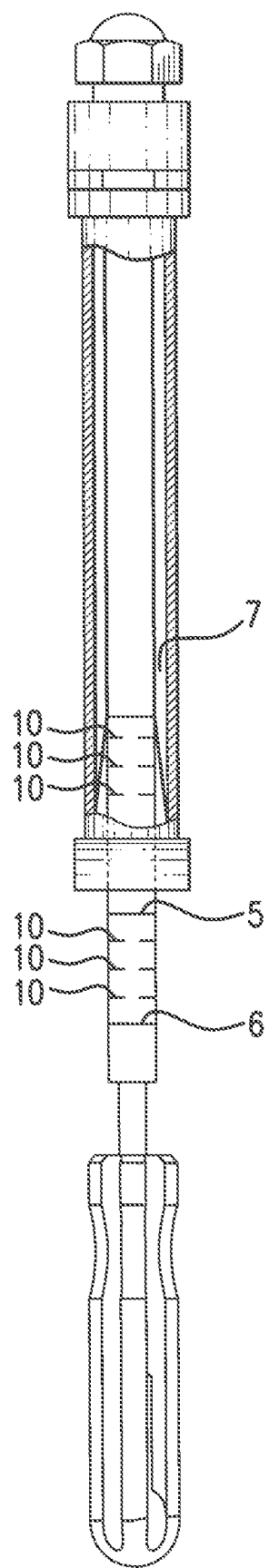
FIG. 6 schematically shows the insertion of a gauge of the invention with a cylindrical gauge body comprising pass/fail markings and hatch marks into a fuse tube after the loss of some ablative arc-extinguishing material due to use, but with enough ablative arc-extinguishing material for further use.

FIG. 6 is similar to FIG. 4 and schematically shows the gauge of FIG. 2, comprising both pass/fail markings and hatch marks, inserted into a similar fuse tube. As stated above, the drawings are for illustration purposes only and are not drawn to scale.

In general the invention provides a gauge for measuring whether a device that requires a consumable material necessary for the safe and/or efficient operation of the device contains enough of the consumable material for safe and effective use, the gauge comprising a gauge portion extending from a handle portion, the gauge portion comprising a gauge body, which gauge body has a distal end and one or more markings at selected distances from the distal end. The gauge body is of a shape and size so that it may be inserted into and progress through a cavity in the device when none or a small of the consumable material is present, but said progress is blocked by the presence of a sufficient amount of the consumable material at a selected point. The markings indicate a depth of insertion beyond which it can be concluded that insufficient consumable material remains. In one embodiment, the gauge of the present invention provides a quick, reliable answer and/or quantitative information about whether a fuse tube contains enough ablative arc-extinguishing material along the appropriate section of a fuse tube for safe and effective use.

Adjusting the gauge for use with other fuse tubes, e.g., tubes with different bore configurations etc., as well as adjustments for use with other types of devices, can be readily accomplished by one of ordinary skill in the art.

What is claimed is:

1. A gauge for measuring whether a device that requires a consumable material contains enough of the consumable material for safe or effective use, the gauge comprising:
   a gauge portion extending from a handle portion,
   the gauge portion comprising a gauge body, the gauge body having a closed distal end and one or more markings at selected distances from the closed distal end,
   the gauge body being of a shape and size enabling the gauge body to be inserted into and progress through a cavity in the device when none of the consumable material is present, wherein the gauge body is configured such that said progress is blocked by a presence of a sufficient amount of the consumable material in the cavity,
   wherein the markings comprise pass/fail markings that indicate a depth of insertion in the cavity, and/or hatch marks that measure a length of the gauge body inserted into the cavity, wherein visibility or lack of visibility of the pass/fail markings, or a number of the hatch marks that are visible, indicate whether enough of the consumable material remains for the safe or effective use of the device.

2. The gauge according to claim 1, wherein the markings are the pass/fail markings that indicate the depth of insertion in the cavity.

3. The gauge according to claim 1, wherein the markings are the hatch marks that measure the length of the gauge body inserted into the cavity.

4. The gauge according to claim 1, wherein the closed distal end of the gauge body has a shape congruent with a shape defined by inner walls of the cavity in a region wherein the consumable material is needed.

5. The gauge according to claim 4, wherein the closed distal end has an outer perimeter smaller than a perimeter of a cross-sectional space defined by the inner walls of the cavity in the region wherein the consumable material is needed, and larger than a perimeter of an opening of the region when containing a full complement of the consumable material.

6. The gauge according to claim 5, wherein the gauge body is cylindrical.

7. The gauge according to claim 6, for determining the presence of adequate amounts of ablative arc-extinguishing material within the cavity of a fuse tube, wherein the closed distal end has a circumference smaller than a circumference of the cavity in an absence of the ablative arc-extinguishing material, and larger than a circumference of the cavity in the presence of an initial loading of the ablative arc-extinguishing material.

8. The gauge according to claim 7, wherein the body is made from a metal or alloy.

9. The gauge according to claim 8, wherein the metal or alloy is a high hardness aluminum.

10. The gauge according to claim 9, wherein the markings are etchings.

11. The gauge according to claim 7, wherein the markings indicate a maximum depth in the cavity at which the tube is in working condition for a specific kV level.

12. The gauge according to claim 1, wherein the device is a fuse tube and the consumable material is ablative arc-extinguishing material.

13. A gauge for measuring whether a device that requires a consumable material contains enough of the consumable material for safe or effective use, the device being a fuse tube and the consumable material being an ablative material in the fuse tube, the gauge comprising:
   a gauge portion extending from a handle portion,
   the gauge portion comprising a gauge body, the gauge body having a closed distal end and a plurality of markings at selected distances from the closed distal end,
   the gauge body being of a shape and a size enabling the gauge body to be inserted into and progress through a cavity in the fuse tube when none of the ablative material is present, wherein the gauge body is configured such that said progress is blocked by a presence of an effective amount of the ablative material,
   wherein the markings are hatch marks to measure how far the gauge has progressed through the gauge body,
   wherein a number of the hatch marks that are visible indicate whether enough of the consumable material remains for the safe or effective use of the device.

14. The gauge according to claim 8, wherein the device is a fuse tube and the consumable material is ablative material, the gauge for determining the amount of the ablative material in the fuse tube,
   wherein the markings comprise the hatch marks to measure how far the gauge has progressed through the gauge body.

15. The gauge according to claim 14, further comprising pass/fail markings on the gauge body.

16. A method for determining whether a device that requires a consumable material contains enough of the consumable material for safe or effective use, the method comprising:
   inserting a gauge according to claim 1 into the cavity of the device, the cavity including the consumable material, until progress of the gauge is blocked by the consumable material,
   observing visibility or lack of visibility of the pass/fail markings or a number of the hatch marks that are visible, to determine whether enough of the consumable material remains for the safe or effective use of the device.

* * * * *